United States Patent [19]

van Tran

[11] Patent Number: 4,618,785

[45] Date of Patent: Oct. 21, 1986

[54] CMOS SENSE AMPLIFIER WITH LEVEL SHIFTER

[75] Inventor: Hiep van Tran, Carrollton, Tex.

[73] Assignee: Thomson Components - Mostek Corporation, Carrollton, Tex.

[21] Appl. No.: 648,091

[22] Filed: Sep. 6, 1984

[51] Int. Cl.[4] .................. H03K 5/24; G11C 7/06
[52] U.S. Cl. .................. 307/530; 307/475; 365/190; 365/208
[58] Field of Search .................. 307/530, 355, 475; 365/189, 190, 207, 208

[56] References Cited

U.S. PATENT DOCUMENTS

| | | | |
|---|---|---|---|
| 4,223,394 | 9/1980 | Pathak et al. | 307/530 X |
| 4,287,570 | 9/1981 | Stark | 365/189 X |
| 4,375,039 | 2/1983 | Yamauchi | 307/530 |
| 4,479,202 | 10/1984 | Uchida | 307/530 X |
| 4,511,810 | 4/1985 | Yukawa | 307/530 X |
| 4,518,879 | 5/1985 | Greene | 307/530 |
| 4,521,704 | 6/1985 | Shinohara et al. | 307/530 |
| 4,544,853 | 10/1985 | Neal et al. | 307/530 |

OTHER PUBLICATIONS

Wong et al, "A 45 ns Fully-Static 16K MOS ROM"; *IEEE ISSCC* 81, 2/19/1981, Digest of Technical Papers, pp. 150-151.

*Primary Examiner*—Larry N. Anagnos
*Attorney, Agent, or Firm*—Roland Plottel

[57] ABSTRACT

A common mode gain enhancing CMOS differential sense amplifier for a static RAM memory, straddled by level shifting circuits during the respective differential inputs to the sense amplifier.

3 Claims, 3 Drawing Figures ic voltage level shifter scheme. The level shifting converts high input voltages from the memory cell to a lower level and maintains or increases the differential operation gain.

CMOS SENSE AMPLIFIER WITH LEVEL SHIFTER

DESCRIPTION

1. Technical Field

The field of art addressed by the invention is that of sense amplifiers made with the CMOS technology, and more particularly that of high gain CMOS sense amplifiers operating at high common mode input voltages.

2. Background Art

CMOS sense amplifiers of the differential amplifier kind have in the past been employed to receive output data signals DATA and DATA' from the memory cells and bit lines of CMOS static RAMs. Such sense amplifiers have provided fast response in amplifying these data signals while providing good power supply rejection noise characteristics.

The bit line voltages of the static RAM are relatively high, since they are maintained above the memory cell trip point, thus preventing inadvertent memory state changes during read operations. A lower operational voltage level for the bit lines would lower the voltage margin for read operation, increasing the gain of the sense amplifier. However, it is desirable as well to obtain adequate gain with input voltages as high as $V_{cc}$.

DISCLOSURE OF INVENTION

According to the invention, high voltage gain at high common mode input voltages is attained by adapting the sense amplifier circuit to incorporate a dual symmetric voltage level shifter scheme. The level shifting converts high input voltages from the memory cell to a lower level and maintains or increases the differential operation gain.

BEST MODE FOR CARRYING OUT THE INVENTION

Figure 1:
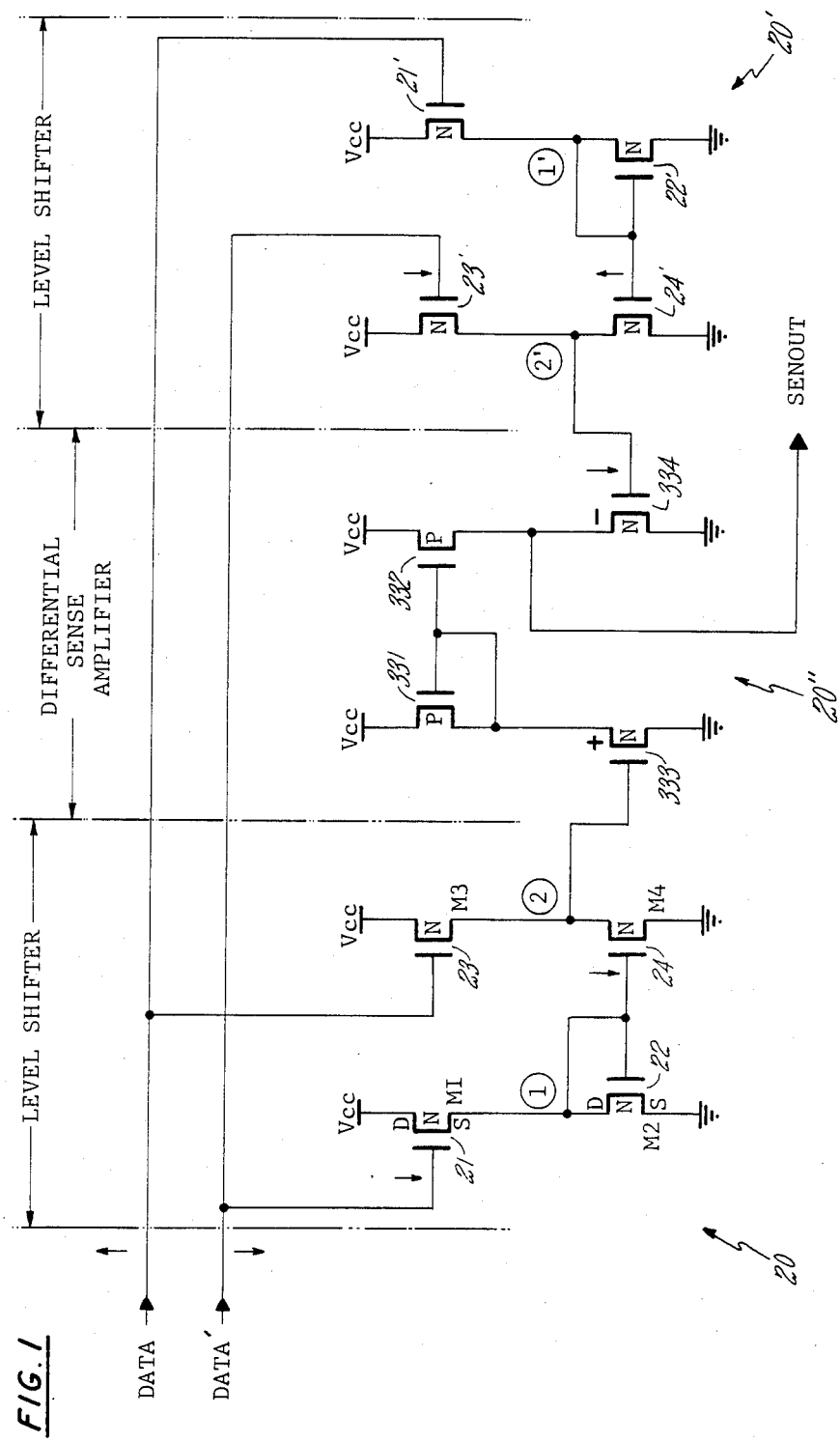
FIG. 1 shows the sense amplifier arrangement according to the present invention, including a pair of level shifters for accommodating high level input signals.

FIG. 1 shows a sense amplifier according to the invention herein. The sense amplifier comprises in part a first level shifter 20 including CMOS transistors 21 through 24, also designated M1 through M4 respectively. Each of the transistors 21-24 is an n-channel MOS transistor.

The gate of transistor 21 is connected to input line DATA' from a memory cell not shown, and the gate of transistor 23 is connected to input line DATA. The respective drains of transistors 21 and 23 are connected to $V_{cc}$, and the source terminals of the respective transistors 21 and 23 are connected to the respective drains of transistors 22 and 24. The sources of transistors 22 and 24 are connected to ground. The gates of transistor 22 and 24 are connected to each other and to the source of transistor 21, which is designated node "one". Node "two" is the connection between transistors 23 and 24.

The DATA and DATA' voltages are equal though jointly changeable in common mode operation. The respective voltages at nodes "one" and "two" are set equal by selecting the sizes of transistors 21–24 such that the size ratio of transistors M2 to M1 equals the size ratio of transistors M4 to M3.

The sense amplifier includes a second level shifter 20' which is a mirror image of level shifter 20, with identical corresponding transistors 21'–24'. The gate of transistor 21 is connected to the DATA' line. The gate of transistor 21' is connected to the DATA line. Similarly, the gate of transistor 23 is connected to the DATA line, and the gate of analogous transistor 23' is connected to the DATA' line. A conventional differential sense amplifier 20'' is connected between level shifters 20 and 20'. Such a conventional differential sense amplifier 20'' includes for example four transistors 331 through 334, the first two of which are p-channel devices connected to $V_{cc}$, and the first of which has its gate connected to its drain to establish a well known current mirror effect effective for equalizing the current flow through the respective first two transistors 331 and 332. The second two transistors 333 and 334 have n-channels and the gates thereof are respectively the positive and negative differential inputs to the differential amplifier 20''. The circuit output is taken at the node between transistors 332 and 334.

Nodes "two" and two' provide input voltages to differential amplifier 20'' at respective positive and negative inputs thereof. These input voltages are equal in common mode operation because the level shifters 20 and 20' have identical components.

The ratio of transistor sizes M2/M1 determines the level shifters' respective common mode voltage gain and the voltage levels to the differential sense amplifiers. The common mode voltage gain of the respective level shifters is desirably minimized to a level much less than one by making M2 much larger in width than M1. Thus, M2 has the primary effect on defining the gain, since M2 is much larger than M1 and M4 is much larger than M3. This causes the voltage drop across M3 and M4 to be felt primarily across M3. The common mode gain is thus maintained at a reduced level.

During differential mode operation, the DATA voltage does not equal DATA'. Respective nodes "one" or "two" are voltage followers of DATA' and DATA respectively. Moreover, node "two" is the inversion of node "one", as DATA is the inversion of DATA'. Accordingly, node "two" is driven by complementary push/pull signals, node "one" and DATA, providing a selected level of voltage gain for node "two". Similarly, corresponding node two' enjoins a corresponding level of voltage gain.

More particularly, level shifter 20 has all of its transistors 21–24 on during common mode operation. When differential mode operation begins, transistors 21, 22 and 23 remain on permitting $V_{cc}$ current to flow to ground. However, in pull operation for example, the transistor 24 reduces the flow of current therethrough because of a diminished voltage level at its gate in response to the reduced voltage level at node "one" derived from the reduction in DATA' and the increase in DATA. Node "two" of course increases in level at the same time. The gate nodes of M1 and M3 are respectively pulled down and up. Also, the respective gates of M3 and M4 are pulled up and down. The gate of M2 is connected to node "one" to insure that the current through M2 is the same as through M4, according to a well known mirror effect.

In push operation, the same scheme is followed except DATA is diminished from common node and DATA' increases. As a result, node "two" is pushed down in voltage by M3, and M4 turns on harder, drawing more current, thus supporting the push down of node "two".

DATA and DATA' are interchanged with respect to nodes one' or two'. Thus, node two' is the voltage follower of DATA'. As a result of amplification, the voltage difference between nodes "two" and two' is larger than that between DATA and DATA'. This is again amplified by the differential amplifier 20" operating at a common mode input voltage determined by the transistor size ratio M2/M1. The gain is settable thus as required.

Figure 2:
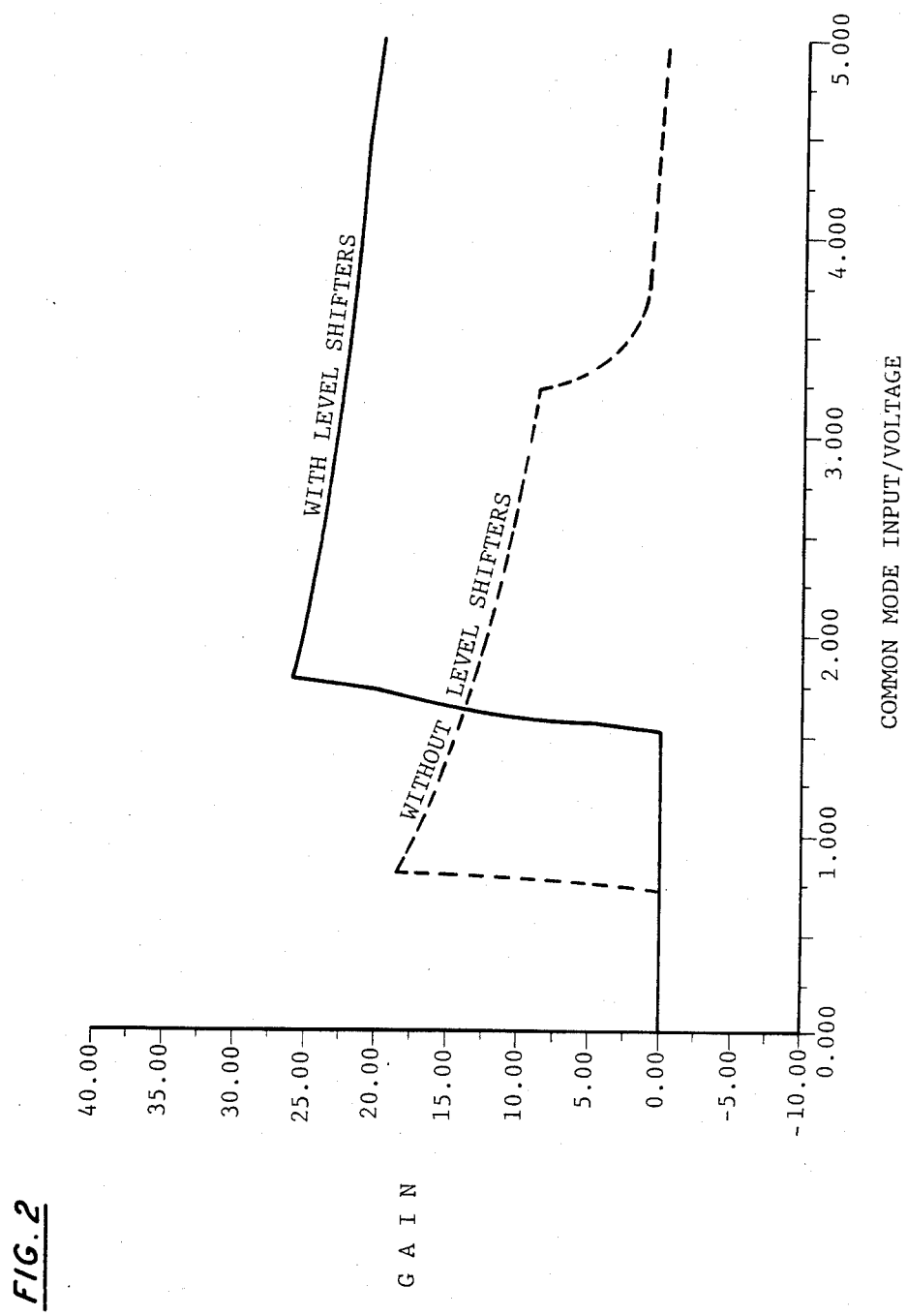
FIG. 2 shows the gain characteristic for common mode input voltages with and without the level shifters according to the invention herein.

FIG. 2 shows the higher differential voltage gain at very high common mode input voltages possible according to the invention in comparison to the previous state of the art.

Figure 3:
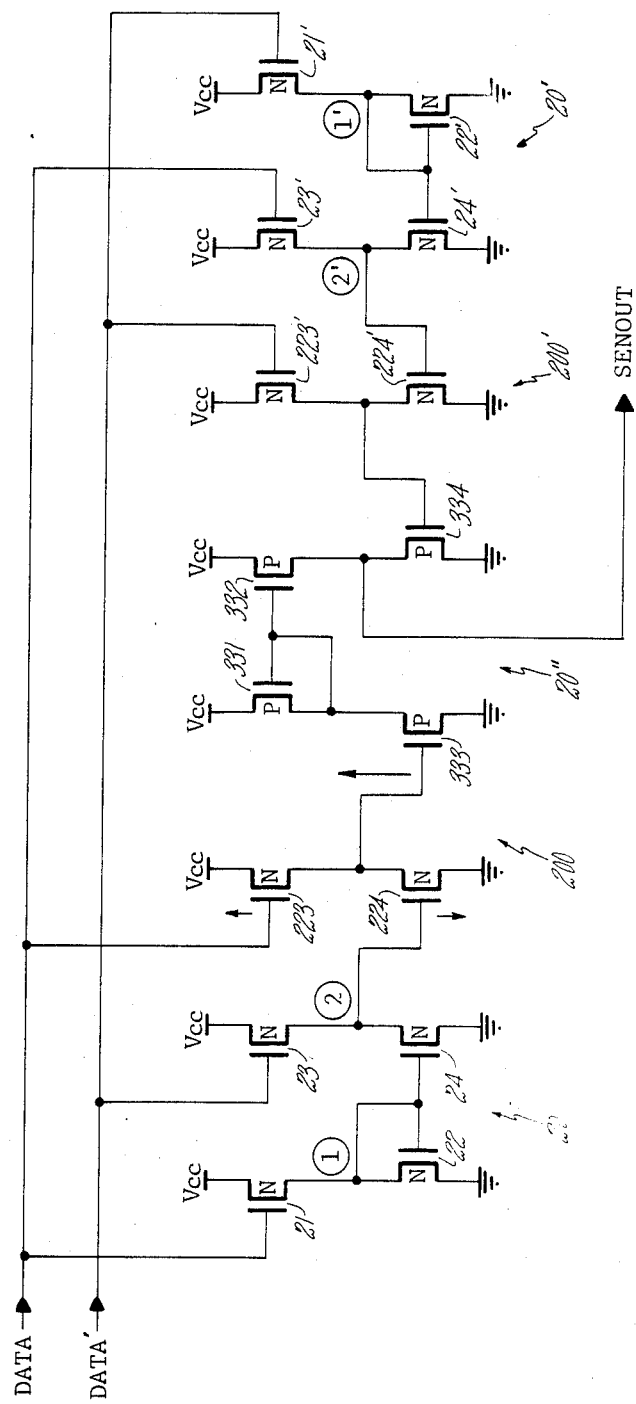
FIG. 3 is a schematic of another version of the invention including additional inverter stages.

FIG. 3 shows another embodiment of the invention which can produce even greater differential gain. In particular, additional inverter stages 200 and 200' are added at the outputs of level shifters 20 and 20' to produce enhanced gain. The gates of transistors 223 and 223' are respectively connected to DATA and DATA'. Transistors 224 and 224' are driven by the outputs of level shifters 20 and 20', and their respective outputs in turn drive the inputs of differential sense amplifier 20".

The gate swings of transistors 223 and 224 are relatively small in comparison with the relatively more significant swing at the inverter output node between transistors 332 and 334, because of the push/pull effect. The transistor gates driven by DATA and DATA' are in each case in phase with their outputs, in effect providing a small level of positive feedback through their respective gates, enhancing the response of the sense amplifier 20" overall and offsetting any signal delay caused by adding level shifters 20 and 20'.

The description above may lead others skilled in the art to develop other embodiments which nonetheless fall within the scope of the invention addressed herein. Accordingly, reference is urged to the claims which follow, as these set forth the metes and bounds of the invention with particularity.

I claim:

1. A sense amplifier for a CMOS static RAM which has a pair of complementary data outputs comprising a CMOS differential amplifier including first and second inputs and an output, first and second level shifters, the first connected between one data output and the first differential amplifier input and the second connected between the other data output and the second differential input, each level shifter comprising two pairs of series-connected MOS transistors, the differential amplifier comprising two pairs of complementary transistors, the level shifters being operatively connected to lower the voltage levels applied to the inputs of the differential amlifier below the levels of the data outputs.

2. A sense amplifier in accordance with claim 1 which includes means forming a pair of voltage buses between which operating power is to be supplied and in which each pair of complementary transistors of the differential amplifier comprises first and second complementary transistors connected between said voltage busses and the gate of the first complementary transistor of each pair is a respective one of the first and second inputs of the differential amplifier and the gates of the second complementary transistors of the pairs are connected together and to the node between the first and second transistors of one pair and the node between the first and second transistors of the second pair is the output of the differential amplifier.

3. A sense amplifier is accordance with claim 2 which includes means forming a pair of voltage buses to be supplied with operating power and in which each level shifter comprises first, second, third and fourth transistors of like type and in which the first and second are serially connected between the voltage buses, and the third and fourth are serially connected between the voltage buses and the node between the first and second is connected to the gates of the second and fourth transistors, the complementary pair of data outputs are connected to the gates of the third and fourth transistors and the node between the third and fourth transistors is connected to an input of the differential amplifier.

* * * * *